Feb. 24, 1970 M. W. BANG 3,497,859

ELECTRICAL RESISTORS FOR PRINTED CIRCUITS

Filed May 28, 1968 2 Sheets-Sheet 1

INVENTOR

MOGENS W. BANG

BY Brown, Critchlow, Flick & Peckham

ATTORNEYS.

ELECTRICAL RESISTORS FOR PRINTED CIRCUITS

Filed May 28, 1968 2 Sheets-Sheet 2

INVENTOR
MOGENS W. BANG

BY Brown, Critchlow, Flick & Peckham
ATTORNEYS.

United States Patent Office 3,497,859
Patented Feb. 24, 1970

3,497,859

ELECTRICAL RESISTORS FOR PRINTED CIRCUITS

Mogens W. Bang, Ridgeway, Pa., assignor to Stackpole Carbon Company, St. Marys, Pa., a corporation of Pennsylvania Filed May 28, 1968, Ser. No. 732,574
Int. Cl. H01c *7/00, 1/02*
U.S. Cl. 338—309 8 Claims

ABSTRACT OF THE DISCLOSURE

An electric component for a printed circuit has a stiff elongated body provided integrally with a plurality of laterally projecting parallel legs for insertion in holes in a printed circuit board. The body is provided with a recess between the terminals. Electrical conducting resistance material is carried by the body, and highly conductive material is carried by the legs in electrical contact with the conducting material to form terminals. The body has shoulders adjoining the legs which form stops when the body is inserted in a printed circuit.

The majority of fixed resistors sold today are used with printed circuit boards, in which they may be inserted by automatic machinery. Most of them have insulated cylindrical bodies with wire leads extending from their opposite ends, which have to be bent laterally into parallel relation so that they can be inserted in the printed circuit board holes. In addition to requiring this bending, and frequently shortening by cutting, the wires often are a source of trouble because of defective electrical contact between them and the resistance material. They also are relatively expensive and do not lend themselves well to automated continuous flow production.

Resistors are on the market which have parallel laterally extending wire leads embedded in their ends. This eliminates the lead-bending problem, but the other disadvantages mentioned above are still present. Another form of resistor in use is formed from a resistor body, on the ends of which metal caps are mounted. Each cap is provided with a lateral projection for insertion in a printed circuit board. Such resistors are relatively expensive to make and the electrical connection between the electric resistance material and the surrounding caps often is unsatisfactory.

It is among the objects of this invention to provide an electric component for insertion in a printed circuit board, which has integral terminals, which is very inexpensive to make, which has no wire leads, which always has good electrical connection between the resistance material and the highly conductive material that serves as the terminals, which does not have to be insulated, which lends itself well to automated continuous flow production, which requires a lower investment in production tooling, which is subject to adjustment for close tolerances, which eliminates customer cutting and bending of wire leads, which can be inserted in printed circuit boards by standard insertion machines, and which gives a wide choice of resistance range, power rating, temperature coefficient of resistance, humidity, and load life characteristics.

The invention is illustrated in the accompanying drawings, in which.

Figure 1:
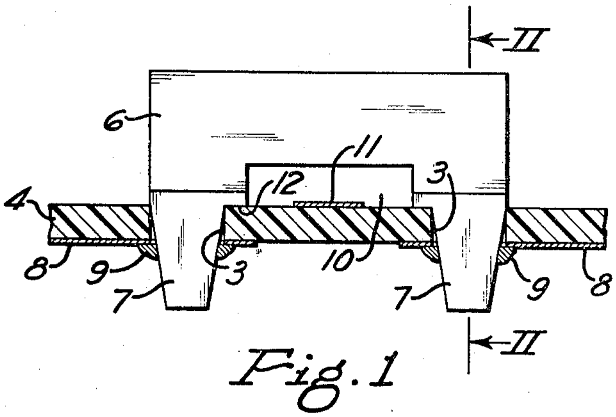
FIG. 1 is a side view of a resistor mounted in a printed circuit board.
Figure 2:
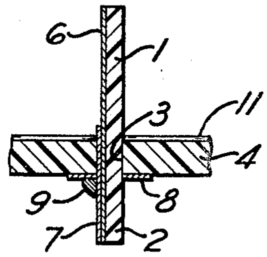
FIG. 2 is a cross section taken on the line II—II of FIG. 1.
Figure 3:
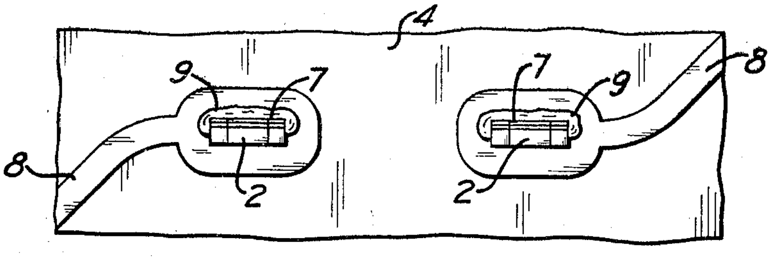
FIG. 3 is a bottom view of the circuit board with the resistor in place.

Referring to FIGS. 1, 2 and 3 of the drawings, a stiff elongated body 1 of an electric component is provided integrally with a laterally projecting leg 2 near each end. The body and its parallel legs are a thin flat substrate of dielectric material, or of metal coated with insulating material to give it a dielectric surface, with the legs at one edge of the body. The substrate may be ceramic or a synthetic plastic, for example, or metal coated with glass or an oxide. The substrate may be formed into the desired shape by stamping, molding or other methods. The legs are of a size, shape and spacing suitable for insertion in small holes 3 in a standard printed circuit board 4. To facilitate insertion, the outer end portions of the legs are tapered toward their outer ends to make them wedge shape.

Applied to one side of the flat substrate is a thin layer or film 6 of electrical conducting material, such as resistance or semi-conducting material. Likewise, applied to the legs on the same side of the substrate is a thin layer or film 7 of highly conductive material, such as copper or silver, which is readily solderable. Layer 6 ordinarily will cover the legs and join layer 7 to them. The highly conductive material on the legs forms terminals for the resistance material, with which it must be in electrical contact. The films can be applied by spraying as the resistors pass lengthwise through suitable apparatus. Preferably, each layer 7 extends a short distance above the printed circuit board. After the legs have been inserted in the board and through openings in the copper conductors 8 on the bottom of the board, the terminals are joined by solder 9 to the conductors to connect the resistor into the circuit. If the substrate is coated metal, the metal can be soldered to a larger copper area on the circuit board which would act as a heat sink. The bottom of the resistor body between the legs is provided with a recess 10 that helps distribute the current over the face of the body and also provides a passage between the body and the circuit board for one or more electrical conductors 11. Recess 10 also makes it unnecessary to cover the resistance material with insulation, because it cannot touch conductor 11. This is especially desirable when the entire substrate has been completely covered with resistance material by spraying or dipping and then the legs 2 have been dipped or sprayed to coat all sides with highly conductive material. To limit the distance that the resistor can be inserted in the board, stops may be formed at the upper ends of the legs by shoulders 12 beside recess 10.

Figure 4:
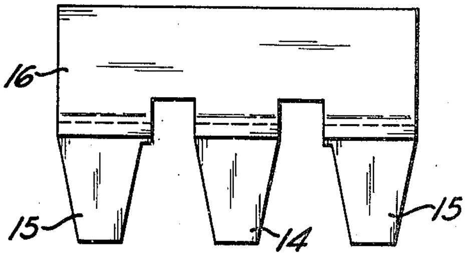
FIG. 4 is a side view of a modified resistor.
Figure 5:
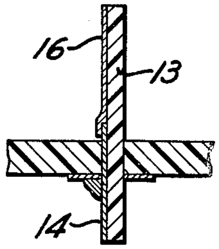
FIG. 5 is a central vertical section through the modified resistor mounted in a printed circuit board.

It also will be seen that another resistance film could be applied to the other side of the substrate and engage terminal layers on that side of the legs. By keeping the two films isolated from each other, and also separating the terminal layers, two resistors would be provided on the same substrate. Then, depending upon the arrangement of conductors on the opposite side of the printed circuit board, the two resistors could be connected in series, in parallel, or in separate circuits. Also, as shown in FIGS. 4 and 5, the substrate 13 may be provided with one or more additional legs and terminals 14 between end terminals 15, in order to form taps on the resistor. In this modification the resistance film 16 is shown overlapping the upper ends of the terminals to make electrical contact with them.

Figure 6:
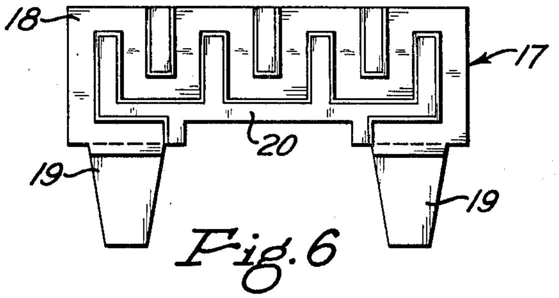
FIG. 6 is a side view of a further embodiment of the invention.

The resistance film shown in FIG. 1 completely covers a side of the substrate body, but, as shown in FIG. 6, it could be applied to a substrate 17 in a pattern, which would reduce the width of the resistance path 18 and increase its length between the two terminals 19. The pattern could be formed by silk-screening or the like, but preferably by providing the substrate with integral ridges 20 in a pattern that leaves a zigzag path between them. The substrate is sprayed with resistance material and then that material is removed, such as by grinding, from the tops of the ridges. The resistance value can be controlled by the depth of the grinding. Also, the resistance value can be controlled by punching or grinding holes or slots in the substrate to reduce the area of the resistor surface.

Figure 7:
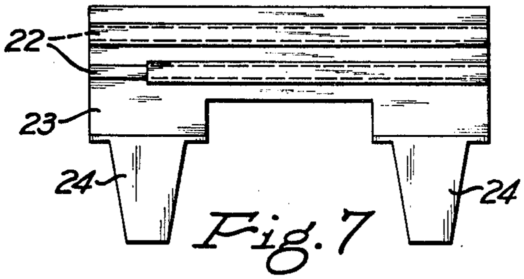
FIG. 7 is a side view of still another embodiment of the invention.
Figure 8:
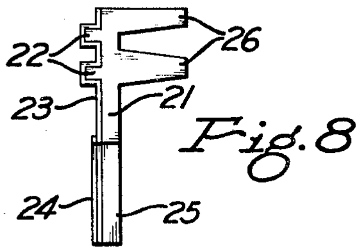
FIG. 8 is an end view of the component shown in FIG. 7.

In the next embodiment of the invention, shown in FIGS. 7 and 8, the substrate body 21 is molded to provide one side with one or more ribs 22 that are covered by the resistance material 23 applied to that side of the body. The ribs increase the area of the resistor surface between the terminals 24 on the legs 25. If desired, the resistance material can be ground off part of the face of one of the ribs as shown in FIG. 7 to make fine adjustments. Also, as shown in FIG. 8, the opposite side of the substrate may be provided with ribs 26 that serve as heat sinks to reduce the operating temperature of the unit.

Figure 9:
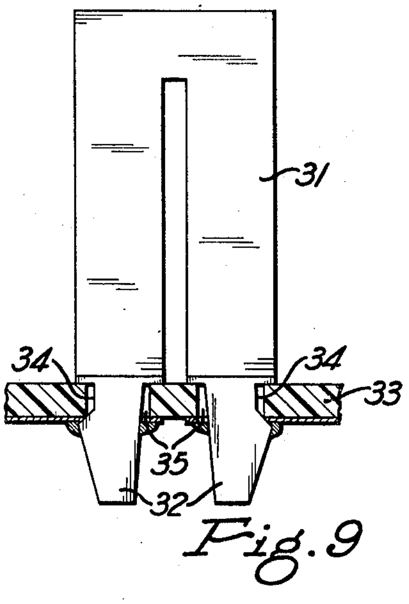

In a further modification, shown in FIG. 9, the flat substrate has a U-shape body coated with conducting material 31, and the integral legs with their terminal layers 32 project from its opposite ends. The size and shape of the substrate can be such that as the legs are inserted in a printed circuit board 33 they can be sprung toward or away from each other slightly to help hold the component in place until it is soldered in the circuit. Preferably, one side of each leg is provided with a notch 34 that will allow the leg to snap into a hole 35 in the circuit board.

Figure 10:
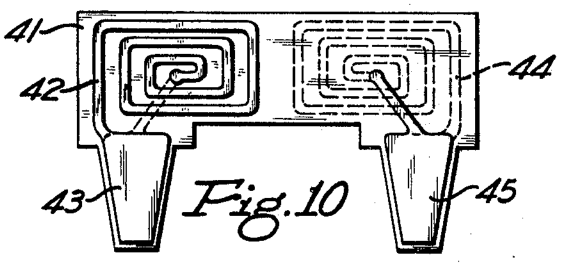
FIGS. 9 and 10 are side views of two more modifications.

This invention also is applicable to such things as miniature inductors or transformers. Thus, as shown in FIG. 10, on each side of a thin flat substrate 41 a layer of highly conductive material, such as metal, may be applied in the form of a coil. The outer end of one coil 42 is joined to a layer of highly conductive material 43 on one side of a substrate leg, while the inner end of the coil extends through a hole in the substrate and is connected with a conductive terminal layer on the other side of the same leg. The other coil 44 of the transformer adheres to the opposite side of the substrate and has its ends electrically connected with the conductive terminal layers 45 on the opposite sides of the other leg. The substrate itself could be made of ferrite to increase the inductance, or there could be a coating of ferrite either over or under the coils.

Figures 11, 12:
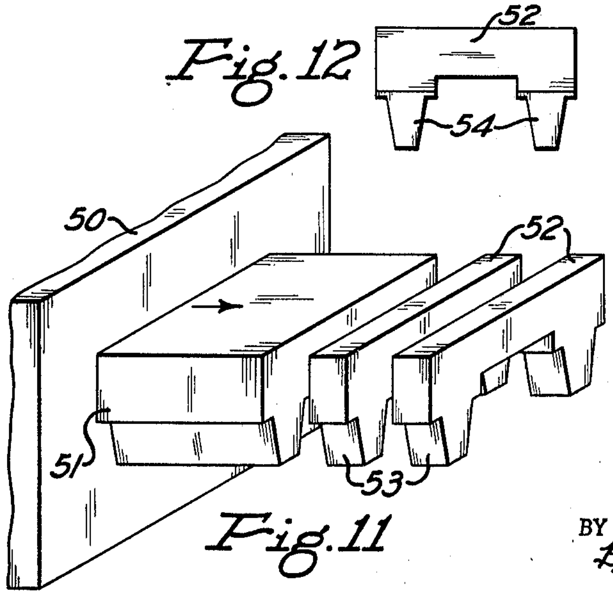
FIG. 11 is a perspective view illustrating a further form of the invention.
FIG. 12 is a side view of one of the components shown in FIG. 11.

A somewhat different application of the invention is shown in FIGS. 11 and 12, in which the stiff body and the integral legs of the component carry resistance material within themselves. Thus, a homogenous resistance material, such as a conductive plastic, or carbon or graphite in a resin binder, is extruded from the nozzle of an extrusion press 50 to form a somewhat channel shape extrusion 51. This extrusion is cut transversely at short intervals to form U-shape bodies 52 provided with parallel integral legs 53 at their ends. The sides of the legs then are covered with a highly conductive solderable material to form terminals 54, as shown in FIG. 12, which of course will be in electrical contact with the resistance material in the legs and body. Instead of extruding the resistance material, it could be molded or pressed into shape if desired.

It will be seen that in every embodiment of the invention the body and terminal leg or legs are made in one piece with the legs in final position for insertion in a printed circuit board by standard insertion machinery. In most cases the bodies and legs are made of dielectric material and are coated with metal or resistance material, or both, to form the desired components. There always is good electrical contact between the terminals and the other conducting material, such as resistance material, of the component. There are no lead wires to bend, cut or become loose. The components do not have to be insulated in order to allow them to be placed across conductors on a printed circuit board. The components are inexpensive to make and are easy to insert in circuit boards.

According to the provisions of the patent statutes, I have explained the principle of my invention and have illustrated and described what I now consider to represent its best embodiment. However, I desire to have it understood that, within the scope of the appended claims, the invention may be practiced otherwise than as specifically illustrated and described.

I claim:

1. An electronic component for printed circuits, comprising a stiff predominantly flat substrate having an elongated body with integral legs at its opposite ends projecting laterally therefrom in parallel relation for insertion in holes in a printed circuit board, the substrate having a dielectric surface, said body having shoulders adjoining the inner ends of the legs to form stops to positively limit said insertion, said body being provided with a recess between the terminals to space the recessed portion of the body from a line joining said shoulders, a layer of electrical resistance material on at least one side of said body, and layers of highly conductive material on said legs in electrical contact with said resistance material on the body to form terminals therefor.

2. An electronic component according to claim 1, in which said shoulders are between the legs, and said recess extends from one shoulder to the other.

3. An electronic component according to claim 1, in which there is a separate layer of said resistance material on each side of said body, and there is a separate layer of said highly conductive material on each side of each leg, each of said last-mentioned layers being electrically connected with only the resistance layer on the same side of the substrate.

4. An electronic component according to claim 1, in which said body is completely covered with said resistance material, and said legs are completely covered with said highly conductive material.

5. An electronic component according to claim 1, in which at least one side of said body is provided with at least one rib extending across it.

6. An electronic component according to claim 1, in which one side of said body is provided with at least one rib extending across it covered at least in part by said layer of resistance material.

7. An electronic component according to claim 1, in which said legs are provided with circuit board receiving lateral notches adjacent said body and can be sprung laterally relative to each other in opposite directions.

8. An electronic component according to claim 1, in which said substrate is provided with an integral ridge projecting through said layer in a position to increase the length of the resistance path between said terminals.

References Cited

UNITED STATES PATENTS

| | | | |
|---|---|---|---|
| 1,889,379 | 11/1932 | Ruben | 338—308 X |
| 2,533,483 | 12/1950 | Losquadro. | |
| 2,668,932 | 2/1954 | Kliever | 338—309 X |
| 2,777,039 | 1/1957 | Thias | 338—309 X |
| 3,185,947 | 5/1965 | Freymodsson. | |

FOREIGN PATENTS

| | | |
|---|---|---|
| 104,468 | 5/1966 | Denmark. |
| 771,701 | 4/1957 | Great Britain. |
| 807,987 | 1/1959 | Great Britain. |
| 880,249 | 10/1961 | Great Britain. |
| 1,259,568 | 3/1961 | Italy. |

E. A. GOLDBERG, Primary Examiner

U.S. Cl. X.R.

317—101; 338—51, 308, 315, 320, 332